US012666982B2

(12) United States Patent
Shim et al.

(10) Patent No.: US 12,666,982 B2
(45) Date of Patent: Jun. 23, 2026

(54) SEMICONDUCTOR PACKAGE

(71) Applicant: Samsung Electronics Co., Ltd.,
Suwon-si (KR)

(72) Inventors: Jong Bo Shim, Anyang-si (KR); Sung Bum Kim, Cheonan-si (KR); Ji Hwang Kim, Cheonan-si (KR)

(73) Assignee: Samsung Electronics Co., Ltd.,
Gyeonggi-do (KR)

( * ) Notice: Subject to any disclaimer, the term of this patent is extended or adjusted under 35 U.S.C. 154(b) by 707 days.

(21) Appl. No.: 17/875,949

(22) Filed: Jul. 28, 2022

(65) Prior Publication Data

US 2023/0076184 A1 Mar. 9, 2023

(30) Foreign Application Priority Data

Sep. 6, 2021 (KR) ........................ 10-2021-0118291

(51) Int. Cl.
*H10W 70/65* (2026.01)
*H10W 70/60* (2026.01)
(Continued)

(52) U.S. Cl.
CPC ......... *H10W 70/65* (2026.01); *H10W 70/685* (2026.01); *H10W 74/117* (2026.01);
(Continued)

(58) Field of Classification Search
CPC ........... H01L 23/49838; H01L 23/3128; H01L 23/49822; H01L 25/105; H01L 24/16;
(Continued)

(56) References Cited

U.S. PATENT DOCUMENTS 9,214,450 B2    12/2015  Wu
9,711,485 B1     7/2017  Berry et al.
(Continued)

FOREIGN PATENT DOCUMENTS

KR    10-2016-0113074 A    9/2016
KR    1020190008723 A     1/2019
(Continued)

OTHER PUBLICATIONS

Korean Office Action dated Aug. 21, 2025 for corresponding Korean Patent Application No. 10-2021-0118291 and its English-language translation.

(Continued)

*Primary Examiner* — Marlon T Fletcher
*Assistant Examiner* — Samuel Jonathan Smith
(74) *Attorney, Agent, or Firm* — Harness, Dickey & Pierce, P.L.C.

(57) ABSTRACT

A semiconductor package is provided. A semiconductor package includes a wiring structure, which includes a first insulating layer and a first wiring pad inside the first insulating layer a semiconductor chip on the wiring structure, an interposer having one surface facing the semiconductor chip and including a second insulating layer and a second wiring pad inside the second insulating layer, a connecting member connecting the first wiring pad and the second wiring pad, a support member in the first recess and between the wiring structure and the interposer, and a mold layer covering the semiconductor chip. One surface of the wiring structure includes a first recess exposing at least a part of the first insulating layer.

17 Claims, 16 Drawing Sheets

(51) Int. Cl.
*H10W 70/685* (2026.01)
*H10W 74/10* (2026.01)
*H10W 74/15* (2026.01)
*H10W 90/00* (2026.01)

(52) U.S. Cl.
CPC ............ *H10W 90/00* (2026.01); *H10W 70/60* (2026.01); *H10W 74/15* (2026.01); *H10W 90/722* (2026.01); *H10W 90/724* (2026.01); *H10W 90/734* (2026.01)

(58) Field of Classification Search
CPC ..... H01L 24/32; H01L 24/73; H01L 25/0652; H01L 2224/16225; H01L 2224/32225; H01L 2224/73204; H01L 2225/1035; H01L 2225/1041; H01L 2225/1058; H01L 23/49816; H01L 23/5389; H01L 25/0657; H01L 23/562; H01L 24/13; H01L 24/29; H01L 24/48; H01L 24/81; H01L 24/83; H01L 24/85; H01L 24/92; H01L 2224/13082; H01L 2224/2919; H01L 2224/48091; H01L 2224/73265; H01L 2224/81801; H01L 2224/8385; H01L 2224/8592; H01L 2224/92125; H01L 2924/15174; H01L 2924/15311; H01L 23/3107; H01L 2224/73103; H10W 74/15; H10W 90/722; H10W 90/724; H10W 70/65; H10W 70/685; H10W 74/117; H10W 90/00; H10W 70/60; H10W 90/734; H10W 74/10
See application file for complete search history.

(56) References Cited

U.S. PATENT DOCUMENTS

| | | | |
|---|---|---|---|
| 10,361,177 | B2 | 7/2019 | Kim et al. |
| 10,475,749 | B2 | 11/2019 | Kim |
| 2010/0123235 | A1* | 5/2010 | Kim ...................... H01L 25/105 |
| | | | 257/692 |
| 2012/0020040 | A1 | 1/2012 | Lin et al. |
| 2014/0367854 | A1 | 12/2014 | Zhao et al. |
| 2016/0133613 | A1* | 5/2016 | Seo .......................... H01L 23/36 |
| | | | 257/686 |
| 2016/0276307 | A1* | 9/2016 | Lin ........................ H01L 23/562 |
| 2017/0221859 | A1 | 8/2017 | Chen et al. |
| 2019/0067258 | A1* | 2/2019 | Kim ...................... H01L 25/117 |
| 2020/0006214 | A1 | 1/2020 | Tsai et al. |
| 2021/0183757 | A1* | 6/2021 | Kim ........................ H01L 25/50 |

FOREIGN PATENT DOCUMENTS

| | | |
|---|---|---|
| KR | 10-2019-0025097 A | 3/2019 |
| KR | 10-2019-0079065 A | 7/2019 |
| KR | 1020200061228 A | 6/2020 |

OTHER PUBLICATIONS

Korean Notice of Allowance dated May 11, 2026 issued in Korean Patent Application No. 10-2021-0118291 and English Translation thereof.

* cited by examiner

SEMICONDUCTOR PACKAGE

CROSS-REFERENCE TO RELATED APPLICATION

This application claims priority from Korean Patent Application No. 10-2021-0118291, filed on Sep. 6, 2021 in the Korean Intellectual Property Office, and all the benefits accruing therefrom under 35 U.S.C. 119, the entire contents of which are incorporated by reference herein.

BACKGROUND

1. Technical Field

The present disclosure relates to a semiconductor package. More specifically, the present disclosure relates to a semiconductor package including an interposer.

2. Description of the Related Art

With development of the electronic industry, there is an increasing demand for higher functionality, higher speed and miniaturization of electronic components. In response to such a tendency, a method of stacking and mounting a plurality of semiconductor chips on a single package wiring structure or a method of stacking a package on the package may be used. For example, a package-in-package (PIP) type semiconductor package or a package-on-package (POP) type semiconductor package may be used.

The POP type semiconductor package may include an interposer for electrically connecting the packages between an upper package and a lower package. The interposer may facilitate the connection between the upper package and the lower package and limit and/or prevent warpage between the upper package and the lower package.

SUMMARY

Aspects of the present disclosure provide a semiconductor package having improved product reliability, by placing a support member between the wiring structure and the interposer.

According to an embodiment, a semiconductor package may include a wiring structure including a first insulating layer and a first wiring pad inside the first insulating layer, and one surface of the wiring structure may include a first recess exposing at least a part of the first insulating layer; a semiconductor chip on the wiring structure; an interposer having one surface facing the semiconductor chip, the interposer including a second insulating layer and a second wiring pad in the second insulating layer; a connecting member connecting the first wiring pad and the second wiring pad; a support member in the first recess and between the wiring structure and the interposer; and a mold layer covering the semiconductor chip.

According to an embodiment, a semiconductor package may include a first wiring structure including a first insulating layer and a first wiring pad in the first insulating layer; a semiconductor chip on the first wiring structure; a second wiring structure including a second insulating layer facing the semiconductor chip and a second wiring pad in the second insulating layer; a support member between the first wiring structure and the second wiring structure; and a mold layer covering the semiconductor chip. A thickness of the support member may be thicker than a distance between one surface of the first wiring structure and one surface of the second wiring structure.

According to an embodiment, a semiconductor package may include a first semiconductor package and a second semiconductor package on the first semiconductor package. The first semiconductor package may include a wiring structure, a semiconductor chip, an interposer, a connecting member, and a support member. The wiring structure may include a first insulating layer and a first wiring pad in the first insulating layer. One surface of the wiring structure may include a first recess exposing at least a part of the first insulating layer. The semiconductor chip may be mounted on the wiring structure. The interposer may have one surface facing the semiconductor chip. The interposer may include a second insulating layer and a second wiring pad in the second insulating layer. The connecting member may connect the first wiring pad and the second wiring pad. The support member may extend into the first recess and may be between the wiring structure and the interposer.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail example embodiments thereof referring to the attached drawings, in which:

FIG. 5 is a schematic cross-sectional view of a semiconductor package according to some embodiments taken along I-I' of FIG. 4;

FIG. 9 is a schematic cross-sectional view of a semiconductor package according to some embodiments taken along I-I' of FIG. 4;

FIG. 10 is a schematic cross-sectional view of a semiconductor package according to some embodiments taken along I-I' of FIG. 4;

FIG. 11 is a schematic cross-sectional view of a semiconductor package according to some embodiments taken along I-I' of FIG. 4;

FIG. 13 is a schematic cross-sectional view of a semiconductor package according to some embodiments taken along I-I' of FIG. 4.

DETAILED DESCRIPTION

Hereinafter, a semiconductor package according to some embodiments will be described referring to FIGS. 1 to 6.

Figure 1:
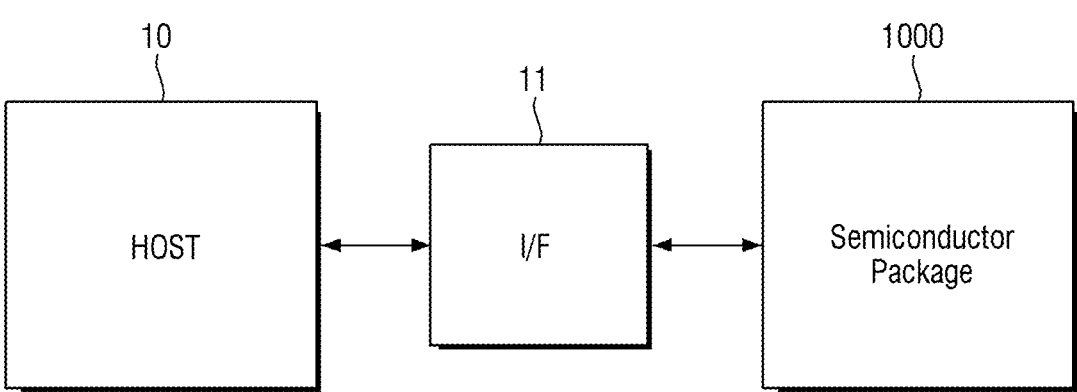
FIGS. 1 and 2 are diagrams for explaining an electronic device according to some embodiments.
Figure 2:
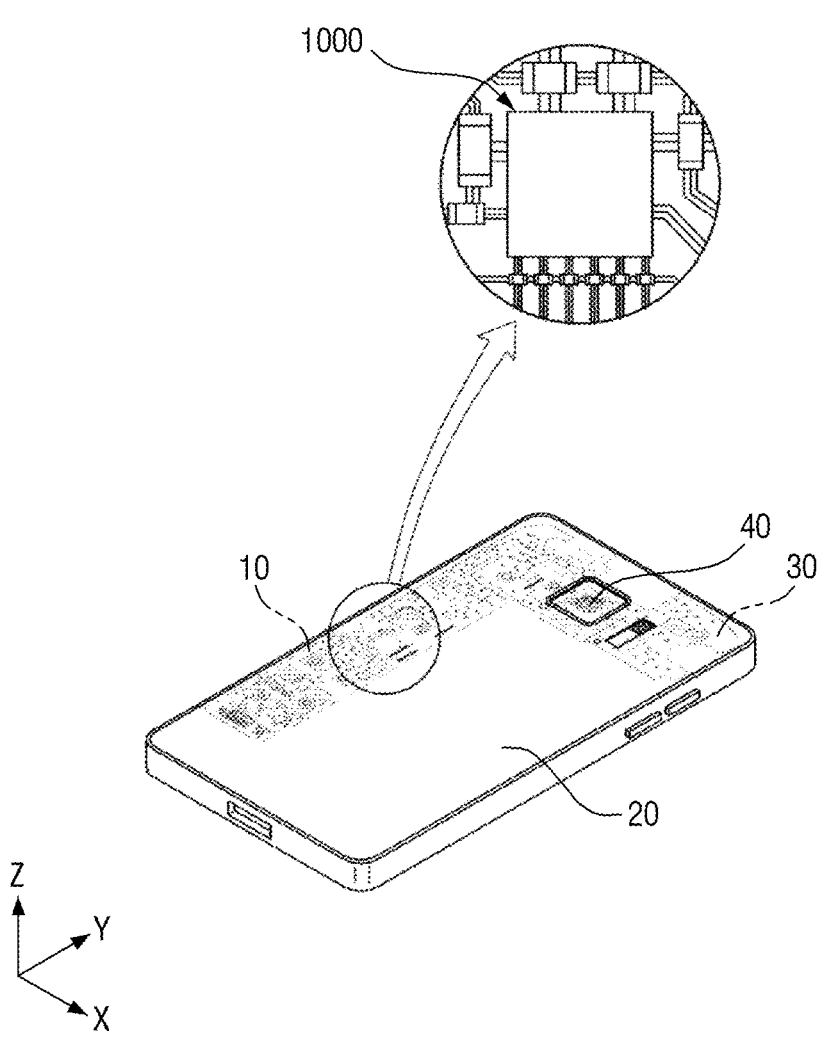
Figure 3:
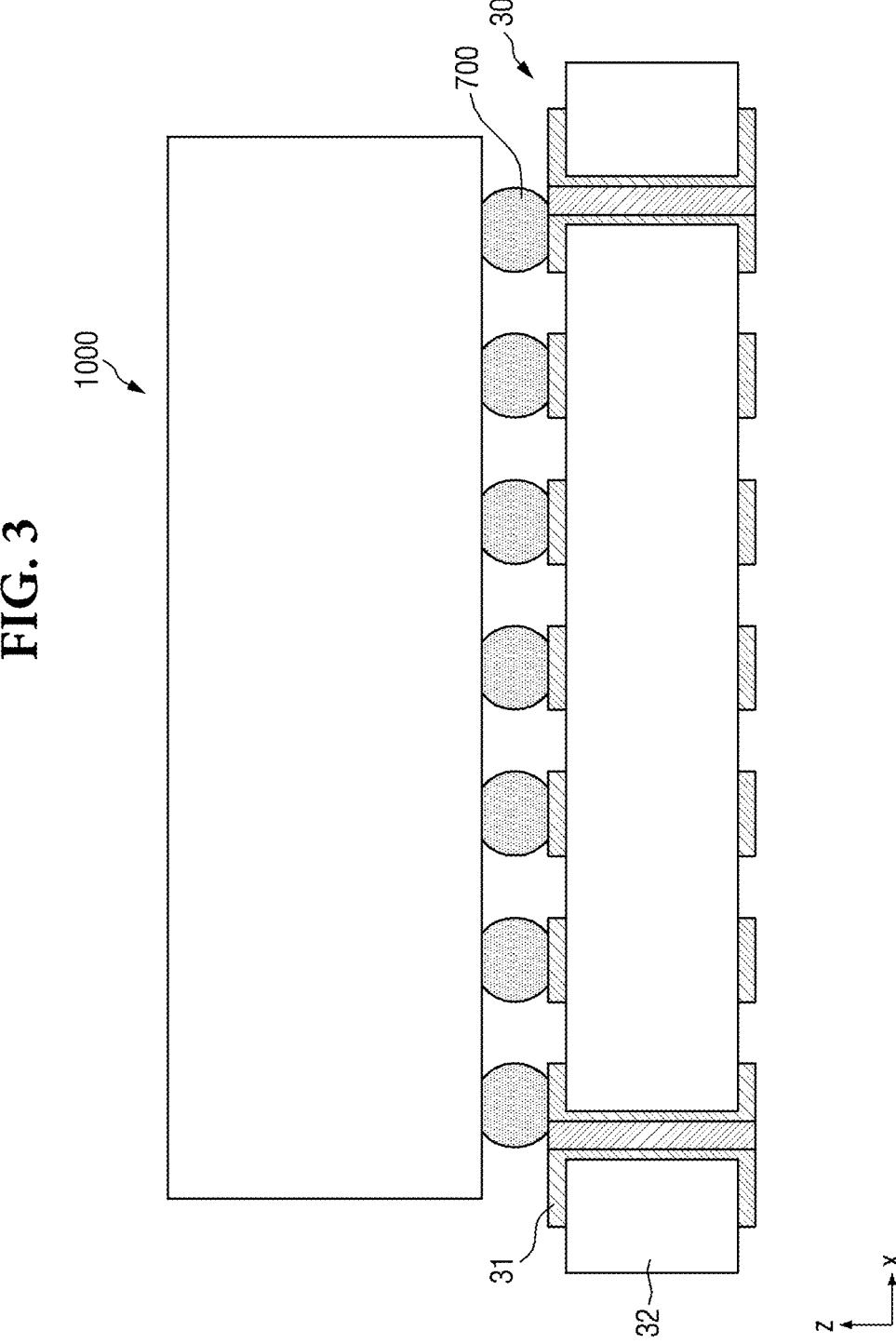
FIG. 3 is a diagram for explaining a semiconductor package and a main board of FIG. 2.
Figure 4:
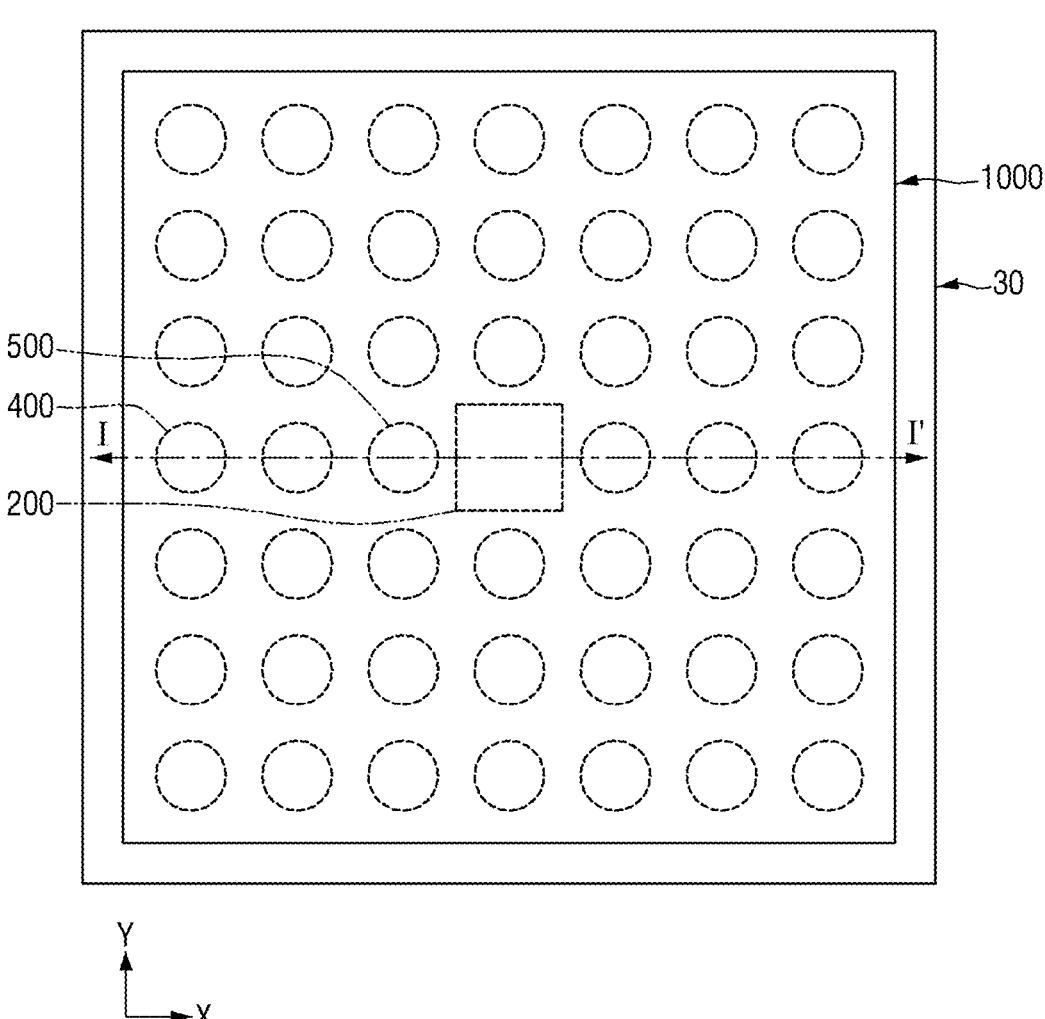
FIG. 4 is an example layout diagram of the semiconductor package according to some embodiments of FIG. 3.
Figure 5:
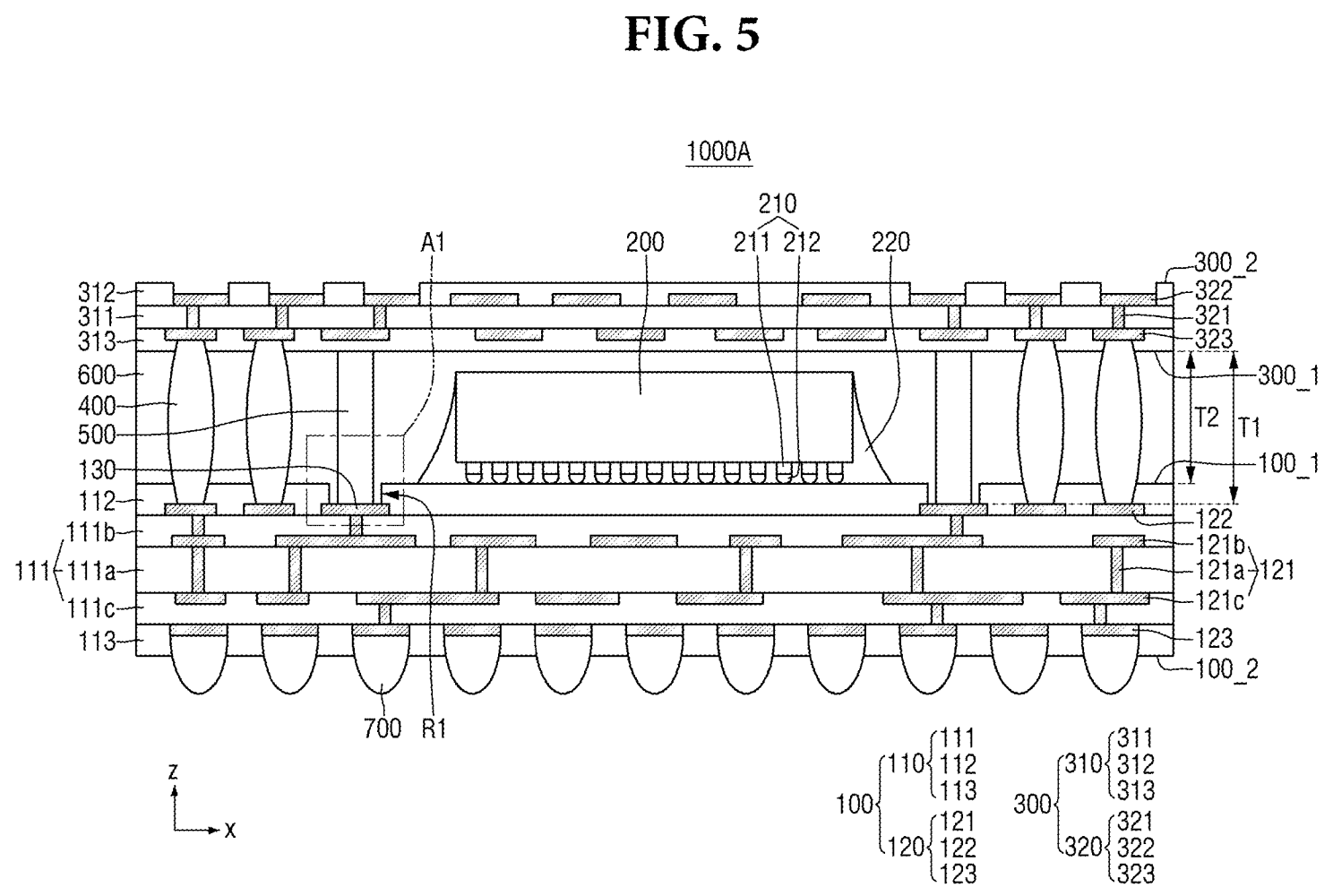
Figure 6A:
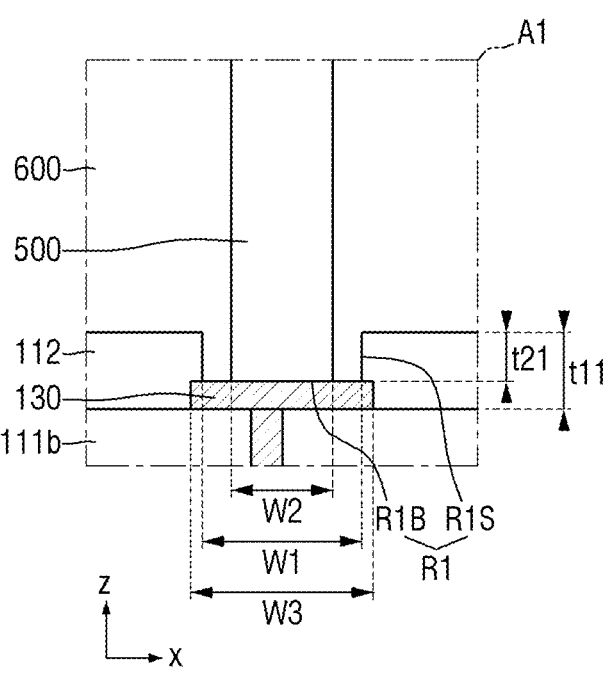
FIGS. 6a to 6c are enlarged views for explaining a region A1 of FIG. 5.
Figure 6B:
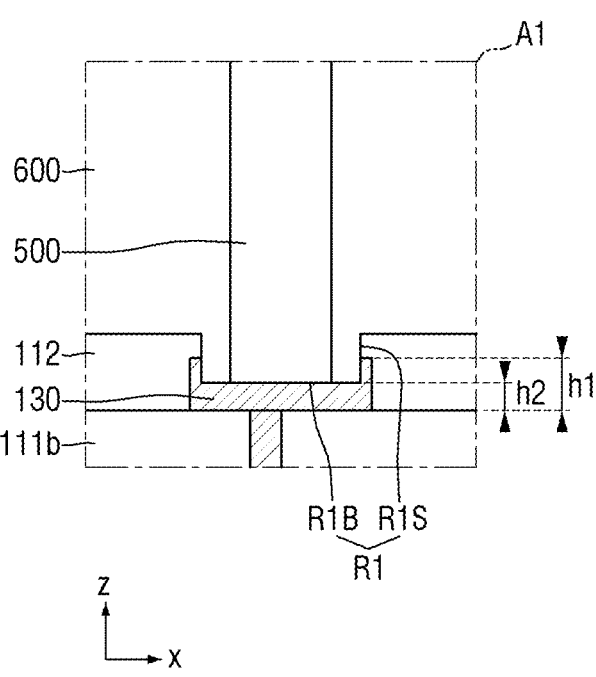
Figure 6C:
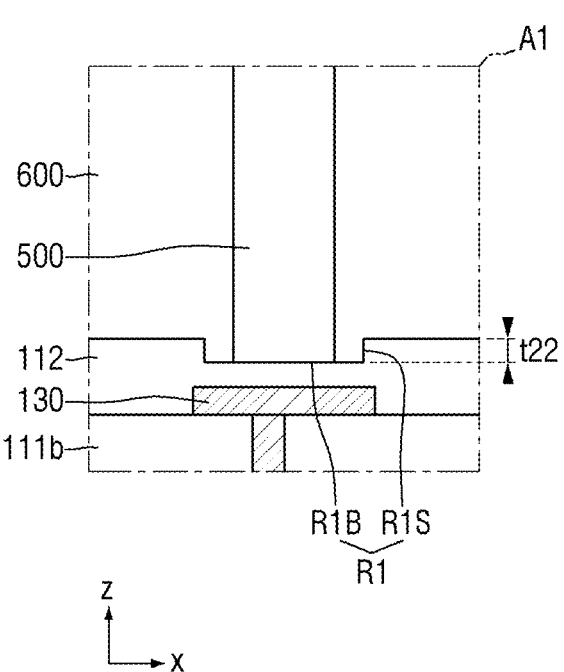

FIGS. 1 and 2 are diagrams for explaining an electronic device according to some embodiments. FIG. 3 is a diagram for explaining a semiconductor package and a main board of FIG. 2. FIG. 4 is an example layout diagram of the semiconductor package according to some embodiments of FIG. 3. FIG. 5 is a schematic cross-sectional view of a semiconductor package according to some embodiments taken along I-I' of FIG. 4. FIGS. 6a to 6c are enlarged views for explaining a region A1 of FIG. 5.

Referring to FIG. 1, an electronic device 1 may include a host 10, an interface 11, and a semiconductor package 1000.

In some embodiments, the host 10 may be connected to the semiconductor package 1000 through the interface 11. For example, the host 10 may transmit a signal to the semiconductor package 1000 to control the semiconductor package 1000. Further, for example, the host 10 may receive the signal from the semiconductor package 1000 and process the data included in the signal.

For example, the host 10 may include a central processing unit (CPU), a controller, an application specific integrated circuit (ASIC), and the like. Further, for example, the host 10 may include a memory chip, such as a DRAM (Dynamic Random Access Memory), a SRAM (Static RAM), PRAM (Phase-change RAM), a MRAM (Magneto resistive RAM), a FeRAM (Ferroelectric RAM) and a RRAM (Resistive RAM).

Referring to FIGS. 1 and 2, the electronic device 1 may include a host 10, a body 20, a main board 30, a camera module 40, and a semiconductor package 1000.

The main board 30 may be mounted inside the body 20 of the electronic device 1. The host 10, the camera module 40, and the semiconductor package 1000 may be mounted on the main board 30. The host 10, the camera module 40, and the semiconductor package 1000 may be electrically connected by the main board 30. For example, the interface 11 may be implemented by the main board 30.

The host 10 and the semiconductor package 1000 may be electrically connected by the main board 30 to transmit and receive signals.

Referring to FIG. 3, the semiconductor package 1000 may be placed on the main board 30. For example, a first connecting structure 700 may be placed on the main board 30. The main board 30 may be connected to the semiconductor package 1000 by the first connecting structure 700.

The main board 30 may be a printed circuit wiring structure (printed circuit board; PCB), a ceramic wiring structure, a glass wiring structure, an interposer wiring structure, or the like. However, example embodiments are not limited thereto. For convenience of explanation, the description will be provided on the assumption that the main board 30 is a printed circuit wiring structure.

The main board 30 may include a connecting structure 31 and a core 32. The core 32 may include a CCL (Copper Clad Laminate), a PPG (Prepreg), an ABF (Ajimoto Build-up Film), epoxy, polyimide and the like. The connecting structure 31 may include, but is not limited to, at least one of copper (Cu), aluminum (Al), silver (Ag), tin (Sn), gold (Au), nickel (Ni), lead (Pb), titanium (Ti), and alloys thereof.

The core 32 is placed at a central part of the main board 30, and the connecting structure 31 may be placed above and below the core 32. The connecting structure 31 may be placed to be exposed above and below the main board 30.

Further, the connecting structure 31 may be placed to penetrate the core 32. The connecting structure 31 may electrically connect elements that come into contact with the main board 30. For example, the connecting structure 31 may electrically connect the semiconductor package 1000 and the host 10. That is, the connecting structure 31 may electrically connect the semiconductor package 1000 and the host 10 through the first connecting structure 700.

Referring to FIG. 5, the semiconductor package according to some embodiments includes a first semiconductor package 1000A that includes a first wiring structure 100, a first semiconductor chip 200, an interposer 300, a connecting member 400, a support member 500, and a first mold layer 600.

The first wiring structure 100 may be a wiring structure for package. For example, the first wiring structure 100 may be a printed circuit wiring structure (PCB; printed circuit board), a ceramic wiring structure, or the like. The first wiring structure 100 may of course be a wiring structure for a wafer level package (WLP) fabricated at a wafer level. The first wiring structure 100 may include one surface 100_1 and the other surface 100_2 that are opposite to each other.

The first wiring structure includes a first insulating layer 110 and a first wiring pad 120. The first insulating layer 110 may include a first substrate 111, a first upper passivation film 112, and a first lower passivation film 113. The first wiring pad 120 may include a first wiring pattern 121, a first upper pad 122, and a first lower pad 123.

The first substrate 111 may be, for example, a printed circuit board (PCB) or a ceramic substrate. However, example embodiments are not limited thereto.

When the first substrate 111 is a printed circuit board, the first insulating layer 110 may be made of at least one material selected from phenol resin, epoxy resin, and polyimide. For example, the first substrate 111 may include at least one material selected from tetrafunctional epoxy, polyphenylene ether, epoxy/polyphenylene oxide, BT (bismaleimide triazine), thermount, cyanate ester, and liquid crystal polymer.

The first substrate 111 may include a resin impregnated in a core material such as glass fiber (glass cloth, glass fabric) together with an inorganic filler, for example, prepreg, ABF (Ajinomoto Build-up Film), or FR-4, BT (Bismaleimide Triazine).

When the first substrate 111 includes a resin impregnated in a core material such as glass fiber together with an inorganic filler, the first substrate 111 may further include a core insulating layer 111a, and upper and lower insulating layers 111b and 111c each placed above and below the core insulating layer 111a. When using the material having high rigidity such as a prepreg including glass fiber or the like, it may be more effective in controlling warpage.

The surface of the first substrate 111 may be covered with a solder resist. That is, the first upper passivation film 112 and the first lower passivation film 113 formed on the surface of the first substrate 111 may be solder resists. The first upper passivation film 112 and the first lower passivation film 113 may include, for example, a photosensitive insulating material (PID: photoimageable dielectric). However, example embodiments are not limited thereto.

The first wiring pad 120 may be placed inside the first insulating layer 110. The first wiring pad 120 may be made up of a first wiring pattern 121 for electrically connecting the first lower pad 123 and the first upper pad 122. The first wiring pattern 121 may include a plurality of upper and lower wiring patterns 121b and 121c, and at least one wiring via 121a for connecting them.

Although the first insulating layer 110 is shown as five layers, this is only for convenience of explanation. For example, it goes without saying that the first insulating layer 110 may be made up of multiple layers more than five layers to form the first wiring pad 120 of multiple layers.

In some embodiments, the first connecting structure 700 may be formed on the other surface 100_2 of the first wiring structure 100. The first connecting structure 700 may be attached to the first lower pad 123.

The first connecting structure 700 may have, for example, but is not limited to, a spherical shape or elliptical spherical shape. Although the first connecting structure 700 may include, for example, at least one of tin (Sn), indium (In), lead (Pb), zinc (Zn), nickel (Ni), gold (Au), silver (Ag), copper (Cu), antimony (Sb), bismuth (Bi), and combinations thereof, example embodiments are not limited thereto.

The first connecting structure 700 may electrically connect the first wiring structure 100 to an external device. Accordingly, the first connecting structure 700 may provide an electric signal to the first wiring structure 100, or may provide an electric signal, which is provided from the first wiring structure 100, to an external device.

The first upper passivation film 112 and the first upper pad 122 may be formed on the upper surface of the first substrate 111. The first upper pad 122 is placed between the first upper passivation film 112 and the first substrate 111. Although not specifically shown, the first upper passivation film 112 may be formed on the first substrate 111 and expose the first upper pad 122.

The first lower passivation film 113 and the first lower pad 123 may be formed on the lower surface of the first substrate 111. The first lower pad 123 may be placed between the first lower passivation film 113 and the first substrate 111. Although not specifically shown, the first lower passivation film 113 may be formed on the first substrate 111 and expose the first lower pad 123.

A first recess R1 that exposes at least a part of the first insulating layer 110 may be formed on one surface 100_1 of the first wiring structure 100. The first recess R1 may have a side wall R1S that exposes at least a part of the first upper passivation film 112, and a bottom surface R1B that is connected to the side wall R1S. The side wall R1S of the first recess R1 extends in the first direction Z to expose at least a part of the first upper passivation film 112, and the bottom surface R1B may extend in the second direction X that intersects the first direction Z.

The first semiconductor chip 200 may be placed on the first wiring structure 100. For example, the first semiconductor chip 200 may be mounted on one surface 100_1 of the first wiring structure 100. The first semiconductor chip 200 may include an integrated circuit (IC) in which hundreds to millions of or more semiconductor elements are integrated in a single chip. For example, the first semiconductor chip 200 may be, but is not limited to, an application processor (AP), such as a CPU (Central Processing Unit), a GPU (Graphic Processing Unit), an FPGA (Field-Programmable Gate Array), a digital signal processor, an encryption processor, a micro processor, and a micro controller. For example, the first semiconductor chip 200 may be a logic chip such as an ADC (Analog-Digital Converter) or an ASIC (Application-Specific IC), and may be a memory chip such as a volatile memory (e.g., a DRAM) or a non-volatile memory (e.g., a ROM or a flash memory). It goes without say that the first semiconductor chip 200 may be formed by combining these elements with each other.

Although only one first semiconductor chip 200 is shown as being formed on the first wiring structure 100, this is merely for convenience of explanation. For example, a plurality of first semiconductor chips 200 may be formed side by side on the first wiring structure 100, or a plurality of first semiconductor chips 200 may be connected to each other by a conductive medium and be sequentially stacked on the wiring structure 100.

In some embodiments, the first semiconductor chip 200 may be mounted on the first wiring structure 100 by a flip chip bonding method. For example, the first bump 210 may be formed between one surface 100_1 of the first wiring structure 100 and the lower surface of the first semiconductor chip 200. The first bump 210 may electrically connect the first wiring structure 100 and the first semiconductor chip 200.

The first bump 210 may include, for example, a first pillar layer 211 and a first solder layer 212.

The first pillar layer 211 may protrude from the lower surface of the first semiconductor chip 200. The first pillar layer 211 may include, for example, but is not limited to, copper (Cu), copper alloy, nickel (Ni), palladium (Pd), platinum (Pt), gold (Au), cobalt (Co) and a combination thereof.

The first solder layer 212 may connect the first pillar layer 211 and the first wiring structure 100. Although not specifically shown, for example, the first solder layer 212 may be electrically connected to some of the first upper pads 122. The first solder layer 212 may have, for example, but is not limited to, a spherical shape or an elliptical spherical shape. The first solder layer 212 may include, for example, but is not limited to, tin (Sn), indium (In), bismuth (Bi), antimony (Sb), copper (Cu), silver (Ag), zinc (Zn), lead (Pb) and combinations thereof.

In some embodiments, a first underfill 220 material may be formed on the first wiring structure 100. The first underfill 220 material may fill up a region between the first wiring structure 100 and the first semiconductor chip 200. The first underfill 220 material may limit and/or prevent the first semiconductor chip 200 from cracking or the like by fixing the first semiconductor chip 200 on the first wiring structure 100. The first underfill 220 material may cover the first bump 210. The first bump 210 may penetrate the first underfill 220 material to electrically connect the first wiring structure 100 and the first semiconductor chip 200.

The first underfill 220 material may include, but is not limited to, an insulating polymer material such as, for example, EMC (epoxy molding compound). In some embodiments, the first underfill 220 material may include a material different from that of the first mold layer 600 to be described below. For example, the first underfill 220 material may include an insulating material having fluidity that is superior to that of the first mold layer 600. Therefore, the first underfill 220 material may efficiently fill up the narrow space between the first wiring structure 100 and the first semiconductor chip 200.

The interposer 300 may be interposed between the first wiring structure 100 and a third wiring structure 800 to be described later. For example, the interposer 300 may be placed on the first wiring structure 100 and the first semiconductor chip 200. In some embodiments, the interposer 300 may mean a second wiring structure 300. The interposer 300 may facilitate the connection between the first wiring structure 100 and the third wiring structure 800. Further, the interposer 300 may limit and/or prevent a warpage phenomenon between the first wiring structure 100 and the third wiring structure 800.

The interposer 300 may include one surface 300_1 and the other surface 300_1 that are opposite to each other. For example, one surface 300_1 of the interposer 300 may face one surface 100_1 of the first wiring structure 100, and the other surface 300_1 of the interposer 300 may face a lower surface of the third wiring structure 800 to be described below.

The interposer 300 may be spaced apart from the first wiring structure 100. Further, the interposer 300 may be spaced apart from the first semiconductor chip 200.

The interposer 300 includes a second insulating layer 310 and a second wiring pad 320. The second insulating layer 310 may include a second lower passivation film 313, a second substrate 311 and a second upper passivation film 312. The second wiring pad 320 may include a second lower pad 323, a second wiring pattern 321 and a second upper pad 322.

The second substrate 311 may be, for example, a printed circuit board (PCB) or a ceramic substrate. However, example embodiments are not limited thereto. In some embodiments, the interposer 300 may include silicon (Si).

The second wiring pad 320 may be placed inside the second insulating layer 310. The second wiring pad 320 may include a second wiring pattern 321 for electrically connecting the second lower pad 323 and the second upper pad 322. For example, the second upper pad 322 may be electrically connected to the second lower pad 323 by coming into contact with the second wiring pattern 321.

Although the second insulating layer 310 is shown as three layers, this is only for convenience of explanation. For example, it goes without saying that the second insulating layer 310 may be made up of multiple layers more than three layers and form the second wiring pad 320 of the multiple layers.

The second upper passivation film 312 and the second upper pad 322 may be formed on the upper surface of the second substrate 311. The second upper passivation film 312 may cover the upper surface of the second substrate 311 and expose the second upper pad 322.

The second lower passivation film 313 and the second lower pad 323 may be formed on the lower surface of the second substrate 311. The second lower passivation film 313 may cover the lower surface of the second substrate 311 and expose the second lower pad 323.

The surface of the second substrate 311 may be covered with a solder resist. That is, the second upper passivation film 312 and the second lower passivation film 313 formed on the surface of the second substrate 311 may be a solder resist. The second upper passivation film 312 and the second lower passivation film 313 may include, for example, but are not limited to, a photoimageable dielectric (PID).

The connecting member 400 may be interposed between the first wiring structure 100 and the interposer 300. The connecting member 400 may come into contact with the upper surface of the first wiring structure 100 and the lower surface of the interposer 300. The connecting member 400 may electrically connect the first wiring structure 100 and the interposer 300. For example, the connecting member 400 may come into contact with the first upper pad 122 of the first wiring structure 100 and the second lower pad 323 of the interposer 300. Accordingly, the connecting member 400 may electrically connect the first wiring pad 120 and the second wiring pad 320.

The connecting member 400 may have, for example, but is not limited to, a spherical shape or an elliptical spherical shape. The connecting member 400 may include, for example, but is not limited to, tin (Sn), indium (In), bismuth (Bi), antimony (Sb), copper (Cu), silver (Ag), zinc (Zn), lead (Pb) and combinations thereof.

The support member 500 is placed inside the first recess R1 and is interposed between the first wiring structure 100 and the interposer 300. The support member 500 may be settled inside the pocket-shaped first recess R1 and may maintain an interval between the first wiring structure 100 and the interposer 300.

Referring to FIG. 5, a thickness T1 of the support member 500 may be thicker than a distance T2 between one surface 100_1 of the first wiring structure 100 and one surface 300_1 of the interposer 300. Further, the thickness of the support member 500 may be thicker than the thickness of the first mold layer 600. Further, the thickness of the support member 500 may be thicker than the thickness of the connecting member 400.

The support member 500 has a first surface placed on one surface 100_1 of the first wiring structure 100, and a second surface that faces the first surface and is placed on one surface 300_1 of the interposer 300.

The support member 500 may be formed in a post shape. The shape of the support member 500 is not particularly limited as long as the interval between the first wiring structure 100 and the interposer 300 may be maintained. The support member 500 may function as a spacer for maintaining the interval between the first wiring structure 100 and the interposer 300.

Although not specifically shown, the support member 500 may also be formed between the outer peripheral surface of the first semiconductor package 1000A and the connecting member 400, in addition to the space between the first semiconductor chip 200 and the connecting member 400. That is, the support member 500 is formed in the outer region of the first wiring structure 100, and may maintain the interval between the first wiring structure 100 and the interposer 300.

The support member 500 may include an insulating material. For example, the support member 500 may include epoxy or the like. However, example embodiments are not limited thereto.

The first wiring structure 100 may further include a support pattern 130 that supports the support member 500 in the lower part of the first surface of the support member 500. The support pattern 130 may include a conductive material. The support pattern 130 may include, for example, but is not limited to, copper (Cu), copper alloy, nickel (Ni), palladium (Pd), platinum (Pt), gold (Au), cobalt (Co) and a combination thereof.

Referring to FIG. 6a, at least a part of the upper surface of the support pattern 130 may come into contact with the first mold layer 600.

The support pattern 130 is formed on the upper insulating layer 111b, and the first upper passivation film 112 may be formed to cover the support pattern 130. After that, by removing at least a part of the first upper passivation film 112, a part of the upper surface of the support pattern 130 may be exposed. After that, the first mold layer 600 may be formed on the upper surface of the exposed support pattern 130.

A width W1 of the first recess R1 may be greater than or equal to a width W2 of the support member 500. For example, the width W1 of the first recess R1 may be 200 μm or less. When the first recess R1 is formed in the first upper passivation film 112, the width W1 of the first recess R1 is not particularly limited as long as it is possible to support the support member 500. Further, a width W3 of the support pattern 130 may be greater than the width W1 of the first recess R1 and the width W2 of the support member 500.

A thickness t11 of the first upper passivation film 112 may be thicker than or equal to a depth t21 of the first recess R1.

Although not specifically shown, the first upper passivation film 112 may be formed of two or more layers. For example, the first upper passivation film 112 may include a first upper film on the upper insulating layer 111*b*, and a second upper film on the first upper film. For example, the thickness of the first upper passivation film 112 may be 30 to 40 µm, and the thickness of each of the first upper film and the second upper film may be 10 to 30 µm. Removal of at least a part of the first upper passivation film 112 may include removal of at least a part of the second upper film placed on the top. In this case, the first recess R1 that exposes the upper surface of the support pattern 130 may be formed. For example, the depth t21 of the first recess R1 may be 10 to 30 µm. The support member 500 may be placed on the upper surface of the exposed support pattern 130. However, example embodiments are not limited thereto.

Conventionally, the interposer 300 may be formed on the first wiring structure 100 through a TC (Thermal Compression) bonding process. For example, a preliminary connecting member is formed on one surface of the interposer 300, a preliminary connecting member is formed on one surface of the first wiring structure 100, and both may be bonded to each other. Further, in the process of filling the first mold layer 600 between the first wiring structure 100 and the interposer 300 after the TC bonding, a phenomenon in which the interposer 300 is pushed may occur. In this case, a problem in which the preliminary connecting member of the interposer 300 and the preliminary connecting member of the first wiring structure 100 are misaligned due to the first mold layer 600 may occur. As a result, the reliability of the semiconductor package may be degraded.

As the support member 500 is placed between the first wiring structure 100 and the interposer 300, the interposer 300 may be supported to maintain a particular distance from the first wiring structure 100 (or the first semiconductor chip 200) in the process of bonding the interposer 300 on the first wiring structure 100. As a result, the reliability of the semiconductor package can be improved.

As the support member 500 is placed inside the first recess R1 of the first wiring structure 100, the pushing phenomenon of the interposer 300 may be limited and/or prevented in the process of filling the first mold layer 600 between the first wiring structure 100 and the interposer 300.

Furthermore, by further placing the support pattern 130 that supports the support member 500, the support member 500 may be more firmly attached to the first wiring structure 100.

Referring to FIG. 6*b*, a height h1 of both end portions of the support pattern 130 may be higher than a height h2 of the upper surface of the support pattern 130 that is in contact with the support member 500. At least a part of the side surface of the support pattern 130 may be in contact with the first mold layer 600.

The support pattern 130 may be formed on the upper insulating layer 111*b*, and the first upper passivation film 112 may be formed to cover the support pattern 130. After that, by removing at least a part of the first upper passivation film 112 and the support pattern 130, a part of the upper surface and the side surface of the support pattern 130 may be exposed. After that, the first mold layer 600 may be formed on the upper surface and the side surface of the exposed support pattern 130.

Although not specifically shown, the first upper passivation film 112 may be formed of two or more layers. For example, the first upper passivation film 112 may include a first upper film on the upper insulating layer 111*b*, and a second upper film on the first upper film. Removal of at least a part of the first upper passivation film 112 may include removal of at least a part of the first upper film placed on the lower part to be exposed. In this case, at least a part of the support pattern 130 may also be removed together to form the first recess R1 that exposes the upper surface of the support pattern 130. The height h1 of the upper surface of both end portions of the support pattern 130 may be higher than the height h2 of the upper surface of the support pattern 130 that is in contact with the support member 500. However, example embodiments are not limited thereto.

Referring to FIG. 6*c*, the support pattern 130 is buried inside the first insulating layer 110 and may not come into contact with the first mold layer 600 to be described later.

After the support pattern 130 is formed on the upper insulating layer 111*b*, the first upper passivation film 112 may be formed to cover the support pattern 130. After that, the first recess R1 may be formed by removing at least a part of the first upper passivation film 112. The support pattern 130 may be buried inside the first upper passivation film 112 and may not be exposed. The support pattern 130 and the support member 500 may be spaced apart from each other with the first upper passivation film 112 interposed therebetween.

A depth t22 of the first recess R1 may correspond to a thickness of the removed first upper passivation film 112.

Although not specifically shown, for example, the first upper passivation film 112 may include a first upper film on the upper insulating layer 111*b*, and a second upper film on the first upper film. Removal of at least a part of the first upper passivation film 112 may include removal of at least a part of the second upper film placed on the upper part to be exposed. In this case, the depth t22 of the first recess R1 may correspond to the thickness of the removed second upper film. For example, the depth t22 of the first recess R1 may be 10 to 30 µm. The support member 500 may be placed on the first recess R1. That is, in this case, the depth t22 of the first recess R1 may be smaller than the depth t21 of the first recess R1 shown in FIG. 6*a*. However, example embodiments are not limited thereto.

The first mold layer 600 may be formed on the first wiring structure 100. The first mold layer 600 may fill up the space between the first wiring structure 100 and the interposer 300. As a result, the first mold layer 600 may cover the first wiring structure 100, the first semiconductor chip 200, the connecting member 400, and the support member 500. The connecting member 400 may penetrate the first mold layer 600 and electrically connect the first wiring structure 100 and the interposer 300.

The first mold layer 600 may include an insulating polymer material such as EMC (epoxy molding compound). The first mold layer 600 may include a thermosetting resin such as an epoxy resin, a thermoplastic resin such as polyimide, or a resin in which a reinforcing material such as a filler is included in these elements, for example, ABF, FR-4, BT resin and the like.

The filler may utilize at least one or more selected from a group including silica ($SiO_2$), alumina ($Al_2O_3$), silicon carbide (SiC), barium sulfate ($BaSO_4$), talc, mud, mica powder, aluminum hydroxide ($Al(OH)_3$), magnesium hydroxide ($Mg(OH)_2$), calcium carbonate ($CaCO_3$), magnesium carbonate ($MgCO_3$), magnesium oxide (MgO), boron nitride (BN), aluminum borate ($AlBO_3$), barium titanate ($BaTiO_3$), and calcium zirconate ($CaZrO_3$). However, the material of the filler is not limited thereto, and may include a metal material and/or an organic material.

Hereinafter, a semiconductor package according to some other embodiments of the present disclosure will be described referring to FIGS. 7 to 8. For convenience of explanation, differences from the semiconductor packages shown in FIGS. 1 to 6 will be mainly described.

Figure 7:
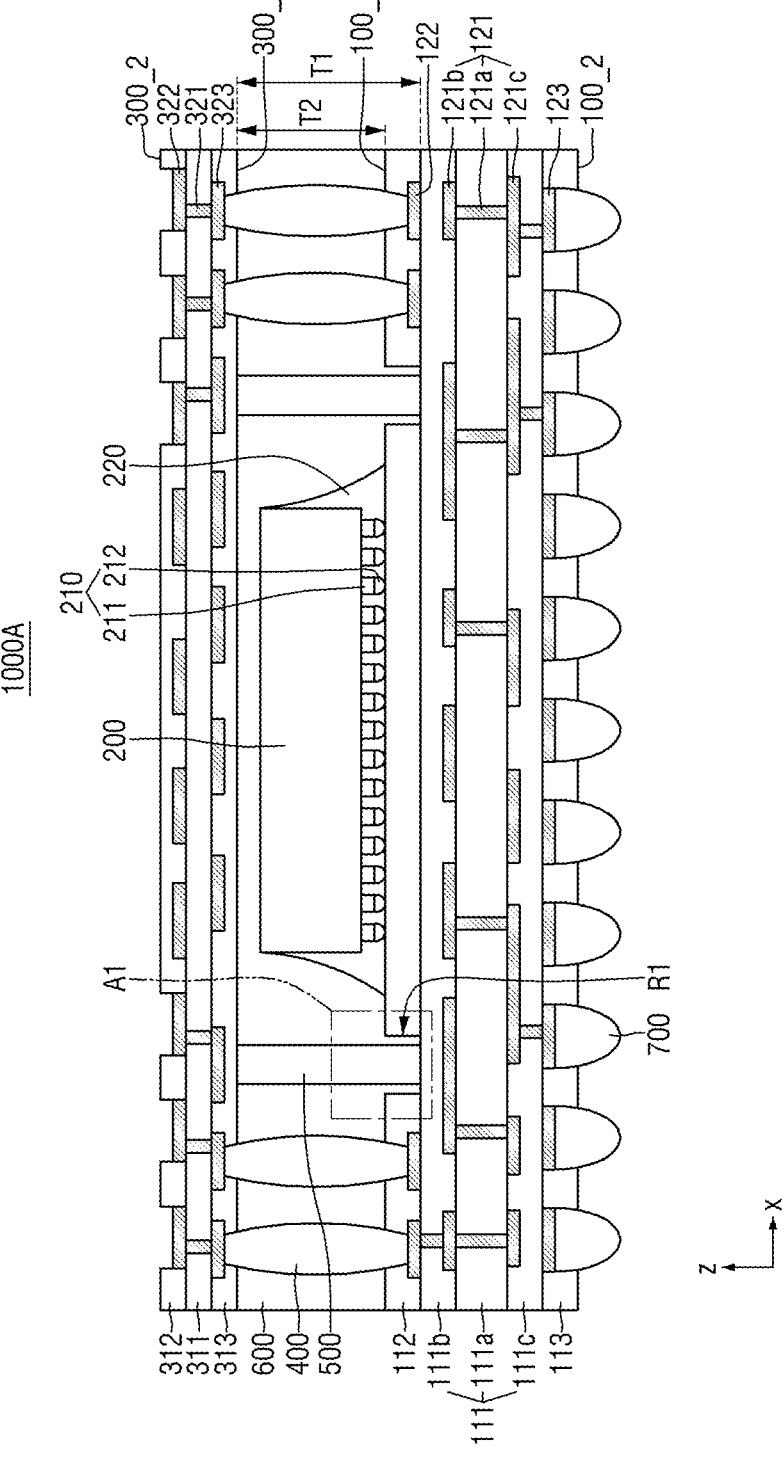
FIG. 7 is a schematic cross-sectional view of a semiconductor package according to some embodiments taken along I-I' of FIG. 4.
Figure 8A:
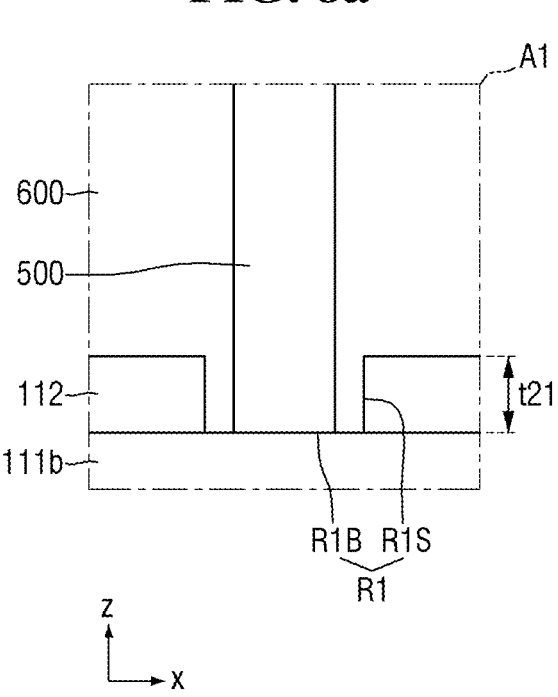
FIGS. 8a and 8b are enlarged views for explaining a region A1 of FIG. 7.
Figure 8B:
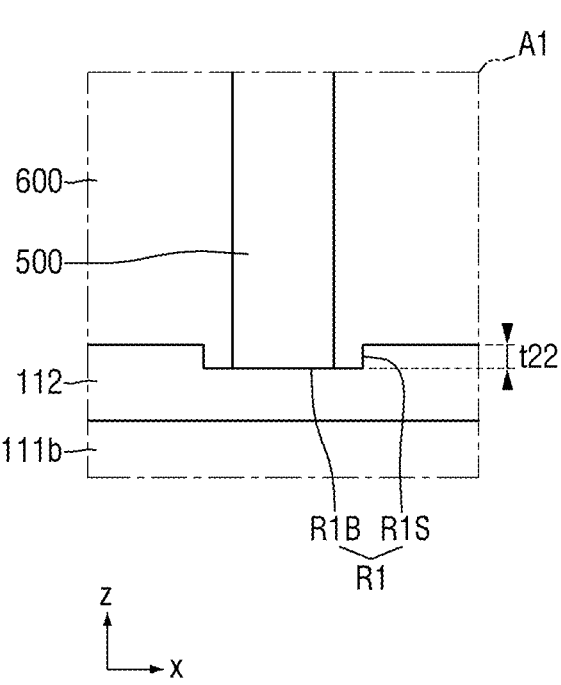

FIG. 7 is a schematic cross-sectional view of a semiconductor package according to some embodiments taken along I-I' of FIG. 4. FIGS. 8a and 8b are enlarged views for explaining a region A1 of FIG. 7.

Referring to FIG. 8a, at least a part of the upper surface of the upper insulating layer 111b exposed by the first recess R1 may come into contact with the first mold layer 600.

The first upper passivation film 112 may be formed on the upper insulating layer 111b. After that, the first recess R1 may be formed by removing at least a part of the first upper passivation film 112. After that, the first mold layer 600 may be formed on the upper insulating layer 111b exposed by the first recess R1.

Although not specifically shown, for example, the first upper passivation film 112 may include a first upper film on the upper insulating layer 111b, and a second upper film on the first upper film. Removal of at least a part of the first upper passivation film 112 may include removal of the first and second upper films. A depth t21 of the first recess R1 may be equal to the thickness of the first upper passivation film 112. For example, the thickness of the first upper passivation film 112 may be 30 to 40 $\mu$m, and the depth t21 of the first recess R1 may be 30 to 40 $\mu$m. The lower surface of the support member 500 may be in direct contact with the upper insulating layer 111b. However, example embodiments are not limited thereto.

Referring to FIG. 8b, only a part of the first upper passivation film 112 is removed, and the upper insulating layer 111b and the first mold layer 600 may not come into contact with each other.

The first upper passivation film 112 may be formed on the upper insulating layer 111b. After that, the first recess R1 may be formed by removing at least a part of the first upper passivation film 112.

The depth t22 of the first recess R1 may correspond to the thickness of the removed first upper passivation film 112.

Although not specifically shown, for example, the first upper passivation film 112 may include a first upper film on the upper insulating layer 111b, and a second upper film on the first upper film. Removal of at least a part of the first upper passivation film 112 may include removal of at least a part of the second upper film placed on the upper part to be exposed. In this case, the depth t22 of the first recess R1 may correspond to the thickness of the removed second upper film. For example, the depth t22 of the first recess R1 may be 10 to 30 $\mu$m. The lower surface of the support member 500 may not come into contact with the upper insulating layer 111b. The upper insulating layer 111b and the support member 500 may be placed apart from each other with the first upper passivation film 112 interposed therebetween. That is, in this case, the depth t22 of the first recess R1 may be smaller than the depth t21 of the first recess R1 shown in FIG. 8a. However, example embodiments are not limited thereto.

Hereinafter, a semiconductor package according to some other embodiments of the present disclosure will be described referring to FIGS. 9 to 10. For convenience of explanation, differences from the semiconductor packages shown in FIGS. 1 to 6 will be mainly described.

Figure 9:
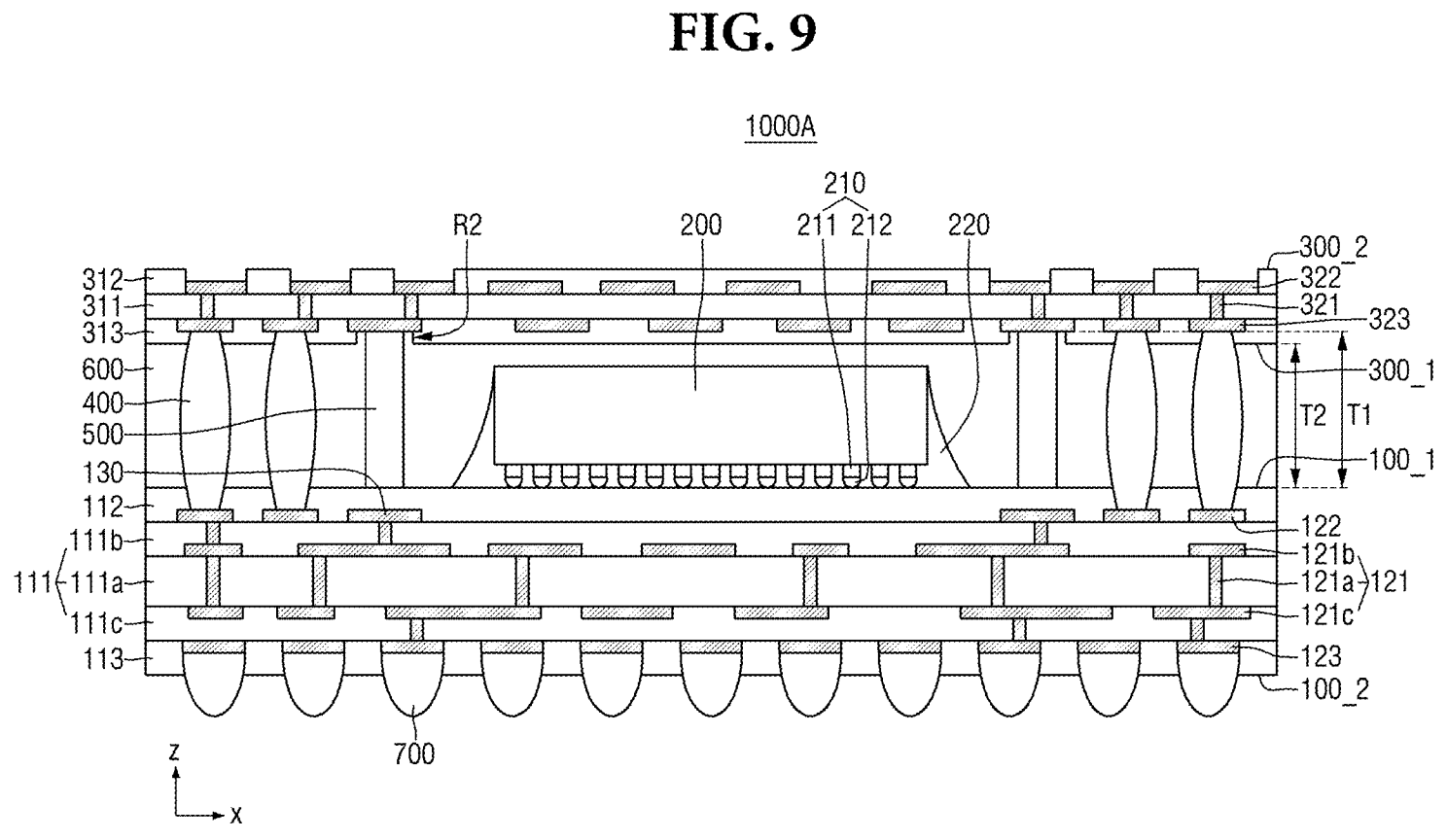

FIG. 9 is a schematic cross-sectional view of a semiconductor package according to some embodiments taken along I-I' of FIG. 4. FIG. 10 is a schematic cross-sectional view of a semiconductor package according to some embodiments taken along I-I' of FIG. 4.

Referring to FIG. 9, the first recess R1 is not formed on one surface 100_1 of the first wiring structure 100, and a second recess R2 that exposes at least a part of the second insulating layer 310 is formed on one surface 300_1 of the interposer 300. The support member 500 is placed inside the second recess R2. The above description of the first recess R1 may be similarly applied to the description of the second recess R2.

A thickness T1 of the support member 500 may be thicker—by the depth of the second recess R2—than a distance T2 between the one surface 100_1 of the first wiring structure 100 and the one surface 300_1 of the interposer 300.

Figure 10:
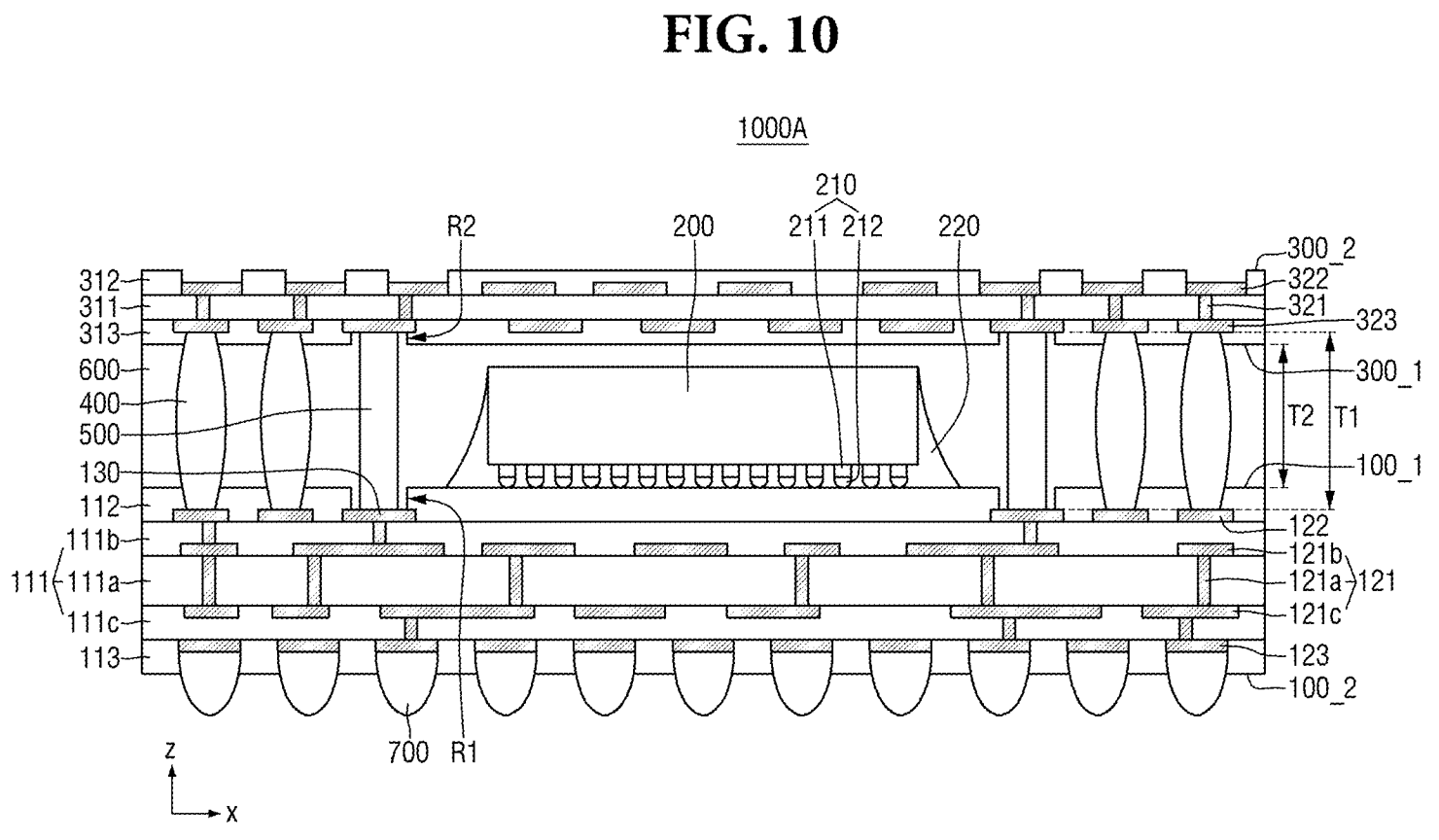

Referring to FIG. 10, the first recess R1 is formed on one surface 100_1 of the first wiring structure 100, and the second recess R2 exposes at least a part of the second insulating layer 310. The second recess R2 is formed on one surface 300_1 of the interposer 300. The support member 500 is placed inside the first and second recesses R1 and R2. The above description of the first recess R1 may be similarly applied to the description of the second recess R2.

The thickness T1 of the support member 500 may be thicker—by the depths of the first and second recesses R1 and R2—than the distance T2 between one surface 100_1 of the first wiring structure 100 and one surface 300_1 of the interposer 300.

Hereinafter, a semiconductor package according to some other embodiments of the present disclosure will be described referring to FIG. 11. For convenience of explanation, differences from the semiconductor packages shown in FIGS. 1 to 6 will be mainly described.

Figure 11:
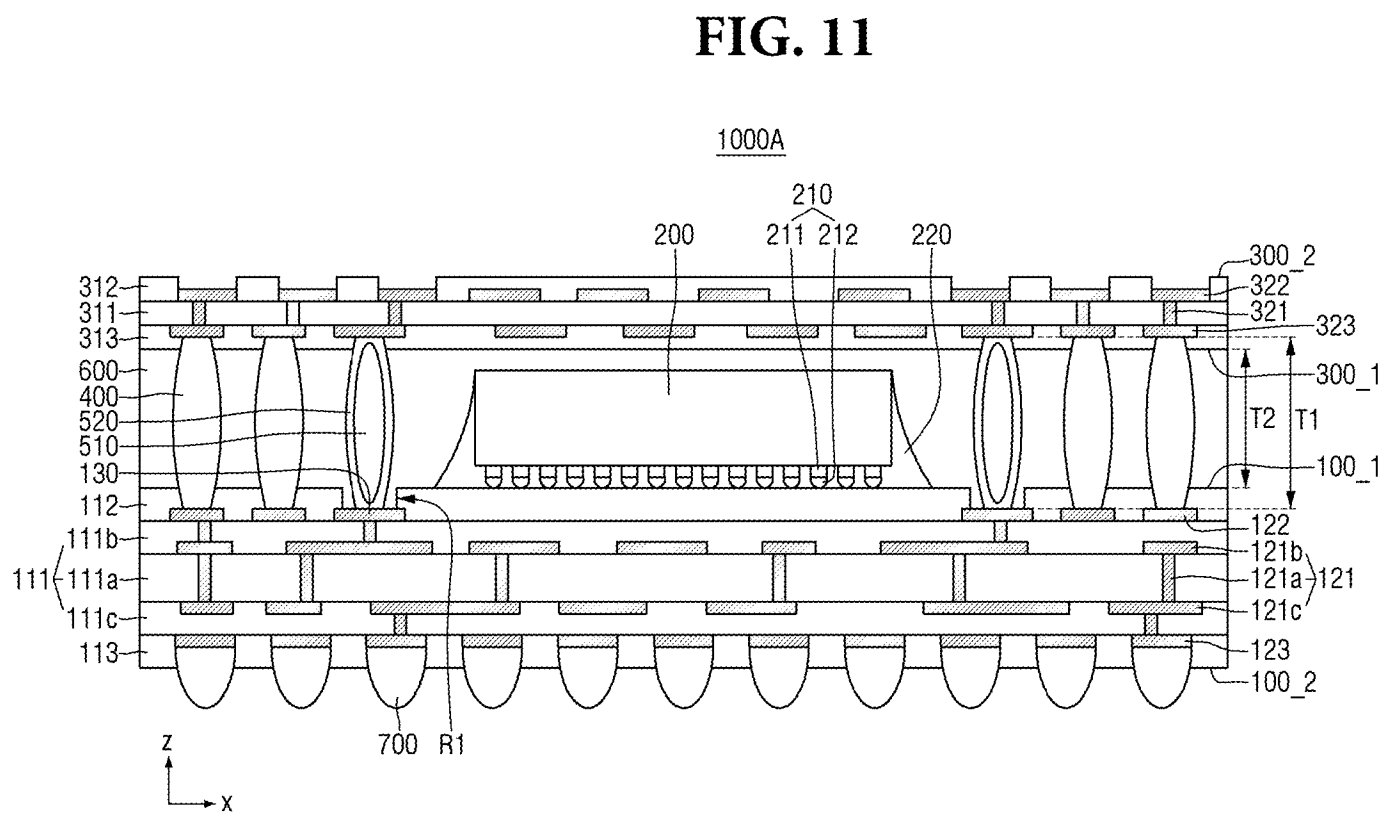

FIG. 11 is a schematic cross-sectional view of a semiconductor package according to some embodiments taken along I-I' of FIG. 4.

Referring to FIG. 11, the support member 500 may include a conductive material. For example, the support member 500 may be formed of a core ball (e.g., Cu core ball). In this case, the support member 500 may include a first layer 510, and a second layer 520 that surrounds the first layer 510. The first layer 510 may include copper (Cu), and the second layer 520 may include tin (Sn). However, example embodiments are not limited thereto. For example, the support member 500 may be a conductive core ball including another conductive material such as gold (Au) or nickel (Ni), instead of the copper core ball (Cu core ball).

The support pattern 130 may come into contact with the first layer 510 of the support member 500 and support the support member 500 at the lower part of the first layer 510. The second lower pad 323 may come into contact with the first layer 510 at the upper part of the first layer 510 of the support member 500.

When the support member 500 includes a conductive material, the support pattern 130 may not be electrically connected to the first connecting structure 700 placed below the first wiring structure 100. The support pattern 130 may support the support member 500, without electrically connecting the core ball (Cu core ball) and the first connecting structure 700.

On the other hand, although not specifically shown, the first wiring structure 100 may not include the support pattern 130. The first layer 510 of the support member 500 is placed inside the first recess R1 and may come into contact with the first upper passivation film 112.

Hereinafter, a semiconductor package according to some other embodiments of the present disclosure will be described referring to FIG. 12. For convenience of explanation, differences from the semiconductor packages shown in FIGS. 1 to 6 will be mainly described.

Figure 12:
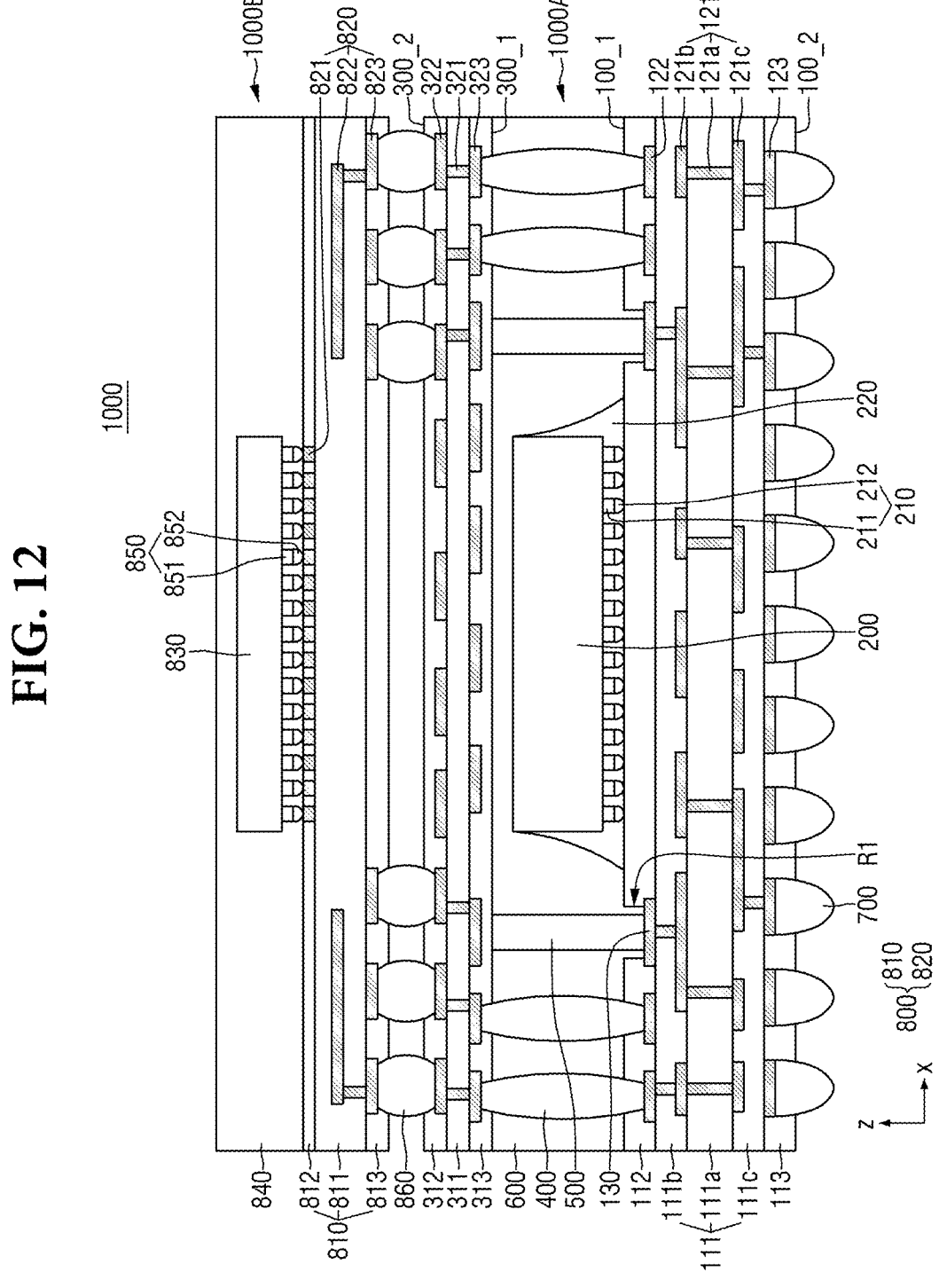
FIG. 12 is a schematic cross-sectional view of a semiconductor package according to some embodiments taken along I-I' of FIG. 4.

FIG. 12 is a schematic cross-sectional view of a semiconductor package according to some embodiments taken along I-I' of FIG. 4.

Referring to FIG. 12, the semiconductor package according to some embodiments further includes a second semiconductor package 1000B including a second semiconductor chip 830 mounted on a third wiring structure 800 on the first semiconductor package 1000A.

The third wiring structure 800 may be placed on the upper surface of the interposer 300. The third wiring structure 800 may be a wiring structure for package. For example, the third wiring structure 800 may be a printed circuit wiring structure (PCB), a ceramic wiring structure, or the like. Alternatively, it goes without saying that the third wiring structure 800 may be a wiring structure for a wafer level package (WLP) fabricated at a wafer level. The third wiring structure 800 may include a lower surface and an upper surface that are opposite to each other.

The third wiring structure 800 includes a third insulating layer 810 and a third wiring pad 820. The third insulating layer 810 may include a third substrate 811, a third upper passivation film 812, and a third lower passivation film 813. The third wiring pad 820 may include a third wiring pattern 821, a third upper pad 822, and a third lower pad 823.

The third substrate 811 may be, for example, a printed circuit board (PCB) or a ceramic substrate. However, example embodiments are not limited thereto.

When the third substrate 811 is a printed circuit board, the third substrate 811 may be made up of at least one material selected from phenol resin, epoxy resin, and polyimide. For example, the third substrate 811 may include at least one material selected from FR-4, tetrafunctional epoxy, polyphenylene ether, epoxy/polyphenylene oxide, BT (bismaleimide triazine), thermount, cyanate ester, polyimide, and liquid crystal polymer.

The surface of the third substrate 811 may be covered with a solder resist. That is, the third upper passivation film 812 and the third lower passivation film 813 formed on the surface of the third substrate 811 may be solder resists. However, example embodiments are not limited thereto.

The third lower passivation film 813 and the third upper passivation film 812 may include, for example, but are not limited to, a photosensitive insulating material (PID; photoimageable dielectric).

The third wiring pad 820 may be placed inside the third insulating layer 810. The third wiring pad 820 may include a third wiring pattern 821 for electrically connecting the third lower pad 823 and the third upper pad 822. The third wiring pattern 821 may include a plurality of wirings and at least one via that connects each wiring.

Although the three layers in the third insulating layer 810 are shown, this is only for convenience of explanation. For example, it goes without saying that the third insulating layer 810 is made up of three or more layers and may include the third wiring pad 820 of multiple layers.

The third upper passivation film 812 and the third upper pad 822 may be formed on the upper surface of the third substrate 811. The third upper passivation film 812 may cover the upper surface of the third substrate 811 and expose the third upper pad 822.

The third lower passivation film 813 and the third lower pad 823 may be formed on the lower surface of the third substrate 811. The third lower passivation film 813 may cover the lower surface of the third substrate 811 and expose the third lower pad 823.

A second connecting structure 860 may be interposed between the interposer 300 and the third wiring structure 800. The second connecting structure 860 may be placed between the other surface 300_2 of the interposer 300 and the lower surface of the third wiring structure 800. The second connecting structure 860 may electrically connect the interposer 300 and the third wiring structure 800. For example, the second connecting structure 860 may come into contact with the second upper pad 322 of the interposer 300 and the third lower pad 823 of the third wiring structure 800.

The second connecting structure 860 may have, for example, but is not limited to, a spherical shape or an elliptical spherical shape. Although the second connecting structure 860 may include, for example, at least one of tin (Sn), indium (In), lead (Pb), zinc (Zn), nickel (Ni), gold (Au), silver (Ag), copper (Cu), antimony (Sb), bismuth (Bi), and combinations thereof, example embodiments are not limited thereto.

The second semiconductor chip 830 may be placed on the third wiring structure 800. For example, the second semiconductor chip 830 may be mounted on the upper surface of the third wiring structure 800. The second semiconductor chip 830 may include an integrated circuit IC in which hundreds to millions or more of semiconductor elements are integrated on a single chip.

In some embodiments, the first semiconductor chip 200 may be a logic chip such as an application processor (AP), and the second semiconductor chip 830 may be a memory chip such as a volatile memory (e.g., DRAM) or a nonvolatile memory (e.g., a ROM or a flash memory).

Although only one second semiconductor chip 830 is shown on the third wiring structure 800, this is only for convenience of explanation. For example, a plurality of second semiconductor chips 830 may be formed side by side on the third wiring structure 800, or a plurality of second semiconductor chips 830 may be sequentially stacked on the third wiring structure 800.

In some embodiments, the second semiconductor chip 830 may be mounted on the third wiring structure 800 by a flip chip bonding method. For example, a second bump 850 may be formed between the upper surface of the third wiring structure 800 and the lower surface of the second semiconductor chip 830. The second bump 850 may electrically connect the third wiring structure 800 and the second semiconductor chip 830.

The second bump 850 may include, for example, a second pillar layer 851 and a second solder layer 852. Since the second pillar layer 851 and the second solder layer 852 may be similar to the first pillar layer 211 and the first solder layer 212 described above, the detailed description will not be provided below.

In some embodiments, a second mold layer 840 may be formed on the third wiring structure 800. The second mold layer 840 may cover and protect the third wiring structure 800, the second semiconductor chip 830, and the second bump 850. The second mold layer 840 may include, for example, but is not limited to, an insulating polymer material such as EMC.

Hereinafter, a semiconductor package according to some other embodiments of the present disclosure will be described referring to FIG. 13. For convenience of explanation, differences from the semiconductor packages shown in FIGS. 1 to 6 will be mainly described.

Figure 13:
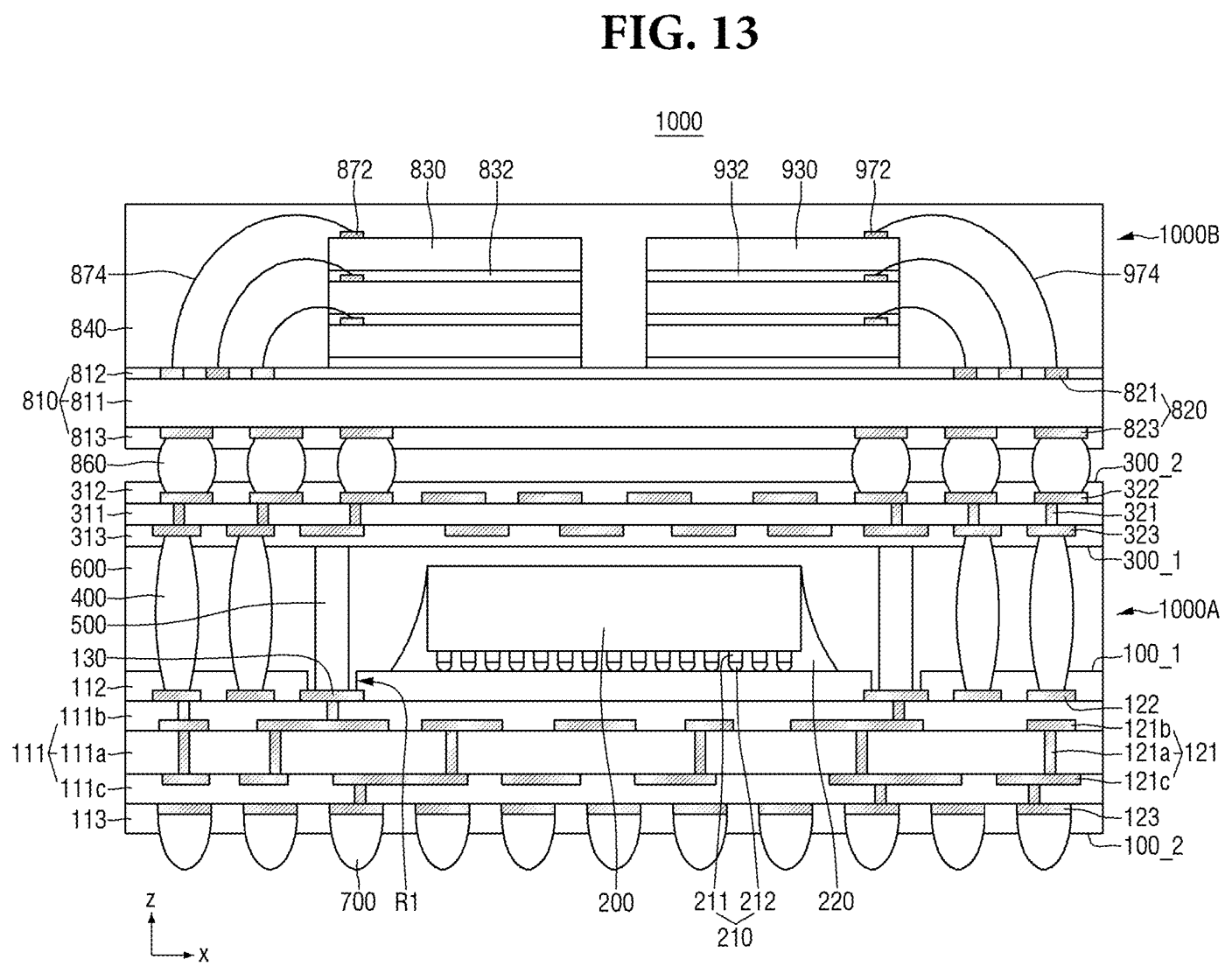

FIG. 13 is a schematic cross-sectional view of a semiconductor package according to some embodiments taken along I-I' of FIG. 4.

Referring to FIG. 13, the semiconductor package according to some embodiments may include second semiconductor chips 830 and third semiconductor chips 930. The second semiconductor chips 830 and the third semiconductor chips 930 may form a stacked structure. The number of stacked structures and the number of semiconductor chips constituting the stacked structures may vary.

For example, the first semiconductor chip 200 may be a logic chip, and the second semiconductor chips 830 and the third semiconductor chips 930 may be memory chips.

The second semiconductor chips 830 may be mounted on the third wiring structure 800 by a third adhesive layer 832. The third semiconductor chips 930 may be mounted on the third wiring structure 800 by a fourth adhesive layer 932. The third adhesive layer 832 and the fourth adhesive layer 932 may include, for example, but are not limited to, at least one of a liquid epoxy, an adhesive tape, a conductive medium, and a combination thereof.

The second semiconductor chips 830 may be electrically connected to the third wiring structure 800 by a first bonding wire 874. For example, the first bonding wire 874 may connect the first chip pad 872 to the third upper pad 822 of the third wiring structure 800. The third semiconductor chips 930 may be electrically connected to the third wiring structure 800 by a second bonding wire 974. For example, the second bonding wire 974 may connect the second chip pad 972 to the third upper pad 822 of the third wiring structure 800. However, example embodiments are not limited thereto, and the second semiconductor chips 830 and/or the third semiconductor chips 930 may be electrically connected to the third upper pad 822 by, for example, a bonding tape or the like.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While some example embodiments of inventive concepts have been described, those skilled in the art will appreciate that many variations and modifications may be made to the presented embodiments without substantially departing from the principles and spirit of embodiments of inventive concepts in the present disclosure. Therefore, the presented embodiments should be considered generic and in descriptive sense only but not for the purpose of limitation.

What is claimed is:

1. A semiconductor package comprising:
a wiring structure including a first insulating layer and a first wiring pad in the first insulating layer, one surface of the wiring structure including a first recess exposing at least a part of the first insulating layer;
a semiconductor chip on the wiring structure;
an interposer having one surface facing the semiconductor chip, the interposer including a second insulating layer and a second wiring pad in the second insulating layer;
a connecting member connecting the first wiring pad to the second wiring pad;
a support member in the first recess and between the wiring structure and the interposer; and
a mold layer covering the semiconductor chip, wherein a thickness of the support member in the first recess is thicker than a distance between the one surface of the wiring structure and the one surface of the interposer, and
the support member includes an insulating material.

2. The semiconductor package of claim 1, wherein the mold layer fills the first recess.

3. The semiconductor package of claim 1, wherein a width of the first recess is greater than a width of the support member.

4. The semiconductor package of claim 1, wherein
the one surface of the interposer includes a second recess that exposes at least a part of the second insulating layer, and
the support member extends into the second recess.

5. The semiconductor package of claim 1, wherein
a first surface of the support member is on the one surface of the wiring structure,
a second surface of the support member faces the first surface,
the second surface of the support member is on the one surface of the interposer, and
the wiring structure further includes a support pattern that supports the support member below the first surface.

6. The semiconductor package of claim 1, wherein
the wiring structure further includes a support pattern that supports the support member in the first recess, and at least part of an upper surface of the support pattern comes into contact with the mold layer.

7. The semiconductor package of claim 5, wherein the support pattern is buried in the first insulating layer and does not come into contact with the mold layer.

8. The semiconductor package of claim 5, wherein
the support pattern is not electrically connected to a connecting structure placed below the wiring structure.

9. A semiconductor package comprising:
a first wiring structure including a first insulating layer and a first wiring pad in the first insulating layer;
a semiconductor chip on the first wiring structure;
a second wiring structure including a second insulating layer facing the semiconductor chip and a second wiring pad in the second insulating layer;
a support member between the first wiring structure and the second wiring structure; and
a mold layer covering the semiconductor chip,
wherein one surface of the first wiring structure includes a first recess having a side wall and a bottom surface,
the side wall of the first recess exposes at least a part of the first insulating layer,
the bottom surface of the first recess is connected to the side wall and formed on the one surface of the first wiring structure,
the support member extends into the first recess,
a thickness of the support member in the first recess being thicker than a distance between the one surface of the first wiring structure and one surface of the second wiring structure, and
the support member includes an insulating material.

10. The semiconductor package of claim 9, wherein the mold layer is on the side wall and the bottom surface of the first recess.

11. The semiconductor package of claim 9, wherein a width of the first recess is greater than a width of the support member.

12. The semiconductor package of claim 9, wherein the one surface of the second wiring structure includes a second recess that exposes at least a part of the second insulating layer, and the support member extends into the second recess.

13. The semiconductor package of claim 9, wherein a first surface of the support member is on the one surface of the first wiring structure, a second surface of the support member is on the one surface of the second wiring structure, and the first wiring structure further includes a support pattern that supports the support member below the first surface of the support member.

14. A semiconductor package comprising:

a first semiconductor package including a wiring structure, a semiconductor chip, an interposer, a connecting member, and a plurality of support members, the wiring structure including a first insulating layer and a first wiring pad in the first insulating layer, one surface of the wiring structure including a first recess exposing at least a part of the first insulating layer, the semiconductor chip mounted on the wiring structure, the interposer having one surface face the semiconductor chip, the interposer including a second insulating layer and a second wiring pad in the second insulating layer, the connecting member connecting the first wiring pad and the second wiring pad, and at least one of the plurality of support members extending between the wiring structure and the interposer, wherein a thickness of the at least one of the plurality of support members in the first recess is thicker than a distance between the one surface of the wiring structure and the one surface of the interposer, the at least one of the plurality of support members and the connecting member are different from each other, the at least one of the plurality of support members in the first recess is arranged between the semiconductor chip and the connecting member, and the semiconductor chip is disposed between the plurality of support members.

15. The semiconductor package of claim 14, further comprising:

a second semiconductor package placed on the first semiconductor package.

16. The semiconductor package of claim 14, comprising:

a mold layer covering the semiconductor chip, wherein the mold layer fills the first recess.

17. The semiconductor package of claim 14, wherein the one surface of the interposer includes a second recess that exposes at least a part of the second insulating layer, and the at least one of the plurality of support members extends into the second recess.

* * * * *